(12) United States Patent
Martyak et al.

(10) Patent No.: US 7,297,669 B2
(45) Date of Patent: Nov. 20, 2007

(54) COPPER CHEMICAL MECHANICAL POLISHING SOLUTIONS USING SULFONATED AMPHIPROTIC AGENTS

(75) Inventors: Nicholas Martyak, Doylestown, PA (US); Glenn Carroll, Norristown, PA (US)

(73) Assignee: Arkema Inc., Philadelphia, PA (US)

( * ) Notice: Subject to any disclaimer, the term of this patent is extended or adjusted under 35 U.S.C. 154(b) by 243 days.

(21) Appl. No.: 10/933,141

(22) Filed: Sep. 2, 2004

(65) Prior Publication Data

US 2005/0037936 A1 Feb. 17, 2005

Related U.S. Application Data

(62) Division of application No. 10/685,730, filed on Oct. 14, 2003, now Pat. No. 6,803,353.

(60) Provisional application No. 60/425,690, filed on Nov. 12, 2002.

(51) Int. Cl.
*H01L 21/302* (2006.01)
(52) U.S. Cl. ............... 510/175; 438/692; 438/693
(58) Field of Classification Search ............... None
See application file for complete search history.

(56) References Cited

U.S. PATENT DOCUMENTS

| | | | | |
|---|---|---|---|---|
| 6,440,856 | B1 * | 8/2002 | Bessho et al. | 438/691 |
| 6,524,167 | B1 * | 2/2003 | Tsai et al. | 451/41 |
| 6,527,622 | B1 * | 3/2003 | Brusic et al. | 451/28 |
| 6,585,786 | B2 * | 7/2003 | Tsuchiya et al. | 51/307 |
| 6,599,370 | B2 * | 7/2003 | Skee | 134/3 |
| 6,632,259 | B2 * | 10/2003 | Weinstein et al. | 51/298 |
| 2002/0032987 | A1 | 3/2002 | Steckenrider et al. | |

FOREIGN PATENT DOCUMENTS

WO WO02/061008 8/2002

* cited by examiner

*Primary Examiner*—Gregory Webb
(74) *Attorney, Agent, or Firm*—Steven D. Boyd

(57) ABSTRACT

A family of slurries useful in modifying exposed surfaces of wafers for semiconductor fabrication are provided along with methods of modifying exposed surfaces of wafers for semiconductor fabrication utilizing such a family of working slurries, and semiconductor wafers. The slurries of the invention are a solution of initial components, the components comprising: a sulfonated zwitterion selected from 2-(N-Morpholino)ethanesulfonic acid, (3-[N-Morpholino]) propanesulfonic acid, 2-[(2-Amino-2-oxoethyl)amino] ethanesulfonic acid, Piperazine-N, N'-bis(2-ethanesulfonic acid), 3-(N-Morpholino)-2-hydroxypropanesulfonic acid, N,N-Bis(2-hydroxyethyl)-2-aminoethanesulfonic acid, 3-(N-Morpholino)propanesulfonic acid, N-(2-Hydroxyethyl)piperazine-N'-(2-ethanesulfonic acid), N-Tris(hydroxymethyl)methyl-2 aminoethanesulfonic acid, 3-[N , N-Bis(2-hydroxyethyl)amino]-2-hydroxypropanesulfonic acid, 3-[N-Tris(hydroxymethyl)methylamino)-2-hydroxypropanesulfonic acid, N-(2-hydroxyethyl)piperazine-N'-(2-hydroxypropanesulfonic acid), Piperazine-N ,N'-bis(2-hydroxypropanesulfonic acid), N-(2-Hydroxyethyl) piperazine-N'-(3-propanesulfonic acid), N-Tris (hydroxymethyl)methyl-3-aminopropanesulfonic acid, 3-[(1,1-Dimethy 1-2-hydroxyethyl)amino]-2-hydroxypropanesulfonic, acid, 2-(N-Cyclohexylamino)ethanesulfonic acid, 3-(Cyclohexylamino)-2-hydroxy-I-propanesulfonic acid, 2-Amino-2-methyl-I-propanol, 3-(Cyclohexylamino)-1-propanesulfonic acid, an oxidizing agent; optionally, a passivating agent; optionally a chelating agent, optionally abrasive particles, optionally a surfactant, optionally a secondary buffering agent and water. The method of the invention comprises the steps of: a) providing a wafer comprising a first material having a surface etched to form a pattern and a second material deposited over the surface of the first material; b) contacting the second material of the wafer with abrasive in the presence of the working slurry; and c) relatively moving the wafer or polishing pad or both while the second material is in contact with the slurry and abrasive particles until an exposed surface of the wafer is planar and comprises at least one area of exposed first material and one area of exposed second material.

7 Claims, No Drawings

COPPER CHEMICAL MECHANICAL POLISHING SOLUTIONS USING SULFONATED AMPHIPROTIC AGENTS

REFERENCE TO RELATED APPLICATION

This application is a divisional of application Ser. No. 10/685,730 filed on Oct. 14, 2003 now U.S. Pat. No. 6,803,353.

This application claims the benefit of U.S. Provisional Application Ser. No. 60/425,690, filed Nov. 12, 2002.

BACKGROUND OF THE INVENTION

1. Field of the Invention

This invention relates to an improved composition of slurries, a process for the chemical mechanical polishing or planarization of semiconductor wafers and to semiconductor wafers made according the foregoing process.

2. Description of the Prior Art

During integrated circuit manufacture, semiconductor wafers used in semiconductor fabrication typically undergo numerous processing steps, including deposition, patterning, and etching steps. Details of these manufacturing steps for semiconductor wafers are reported by Tonshoff et al., "Abrasive Machining of Silicon", published in the *Annals of the International Institution for Production Engineering Research*, (Volume 39/2/1990), pp. 621-635. In each manufacturing step, it is often necessary or desirable to modify or refine an exposed surface of the wafer in order to prepare the wafer for subsequent fabrication or manufacturing steps. In conventional semiconductor device fabrication schemes, a silicon wafer is subjected to numerous processing steps that deposit uniform layers of two or more discrete materials which together form a single layer of what will become a multi-layer structure. In this process, it is common to apply a uniform layer of a first material to the wafer itself or to an existing layer of an intermediate constructed by any of the means commonly employed in the art, to etch features into or through that layer, and then to fill the features with a second material. Alternatively, features of approximately uniform thickness comprising a first material may be deposited onto the wafer, or onto a previously fabricated layer of the wafer, usually through a mask, and then the regions adjacent to those features may be filled with a second material to complete the layer. Following the deposition step, the deposited material or layer on a wafer surface generally needs further processing before additional deposition or subsequent processing occurs. When completed, the outer surface is substantially globally planar and parallel to the base silicon wafer surface. A specific example of such a process is the Damascene processes.

In the Damascene process, a pattern is etched into an oxide dielectric (e.g., $SiO_2$) layer. After etching, optional adhesion and or barrier layers are deposited over the oxide surface. Typical barrier layers may include tantalum, tantalum nitride, titanium nitride or titanium, or tungsten. Next, a metal (e.g., copper) is deposited over or on top of the adhesion and or barrier layers. The copper metal layer is then modified, refined or finished by removing the copper metal and regions of the adhesion and or barrier layer on the surface of the underlying dielectric. Typically, enough surface metal is removed so that the outer exposed surface of the wafer comprises both metal and an oxide dielectric material. A top view of the exposed wafer surface would reveal a planar surface with copper metal corresponding to the etched pattern and barrier layer or dielectric material adjacent to the copper metal. The copper (or other metal) and oxide dielectric material(s) located on the modified surface of the wafer inherently have different hardness values and susceptibly to controlled corrosion. The method to modify the surface of the semiconductor may be a combination of a physical and chemical process. Such a process is called chemical mechanical planarization (CMP). An abrasive CMP process used to modify a wafer produced by the Damascene process must be designed to simultaneously modify the metal (e.g., copper) and barrier layer or dielectric materials without inducing defects in the surface of either material. The abrasive process must create a planar outer exposed surface on a wafer having an exposed area of a metal and an exposed area of a dielectric material.

Chemical mechanical polishing (or planarization) (CMP) is an area in semiconductor processing undergoing rapid changes. CMP provides global (millimeter-sized dimensions) and local (micron to nanoscale-sized) planarization on the wafer surface. This planarity improves the coverage of the wafer with dielectric materials and metals (e.g., copper) and increases lithography, etching and deposition process latitudes. Various equipment companies are advancing CMP technology through improvements in the engineering aspects of CMP while chemical companies are focusing on consumables such as slurries and polishing pads. For example, conventional CMP methods for modifying or refining exposed surfaces of structured wafers uses techniques that polish a wafer surface with a slurry containing a plurality of loose abrasive particles dispersed in an aqueous medium. Typically this slurry is applied to a polishing pad and the wafer surface is rotated against the pad in order to remove the desired material from the wafer surface. Generally, the slurry may also contain chemical agents that react with the wafer surface to enhance metal removal rates.

A relatively new alternative to CMP slurry methods uses an abrasive pad to planarize a semiconductor surface and thereby eliminate the need for the foregoing slurries containing polishing particles. This alternative CMP process is reported in International Publication No. WO 97/11484, published Mar. 27, 1997. The abrasive pad has a textured abrasive surface which includes abrasive particles dispersed in a binder. During polishing, the abrasive pad is contacted with a semiconductor wafer surface, often in the presence of a working slurry containing no additional abrasive particles. The aqueous slurry is applied to the surface of the wafer to chemically modify or enhance the removal of a material from the surface of the wafer under the action of the abrasive article.

Working slurries useful in the process described above, either in conjunction with the aforementioned slurries or the abrasive pad, are typically aqueous solutions of a variety of additives including metal complexing agents, oxidizing agents, passivating agents, surfactants, wetting agents, buffers, viscosity modifiers or combinations of these additives. Additives may also include agents which are reactive with the second material, e.g., metal or metal alloy conductors on the wafer surface such as oxidizing, reducing, passivating, or complexing agents. Examples of such working slurries may be found, for example, in U.S. patent application Ser. No. 09/091,932 filed Jun. 24, 1998.

Variables that may affect wafer CMP processing include the selection of the contact pressure between the wafer surface and abrasive article, composition of the polishing pad, use of a sub-polishing pad, geometry of the grooves in the polishing pad, type of slurry medium, relative speed and relative motion between the wafer surface and the abrasive article, and the flow rate of the slurry medium. These variables are interdependent, and are selected based upon the individual metal surface being polished.

CMP processes for modifying the deposited metal layer until the barrier layer or oxide dielectric material is exposed on the wafer outer surface leaves little margin for error because of the sub-micron dimensions of the metal features found on the wafer surface. The removal rate of the deposited metal should be relatively fast to minimize the need for additional expensive CMP tools, and the metal must be completely removed from the areas that were not etched. The metal remaining in the etched areas must be limited to discrete areas while being continuous within those areas or zones to ensure proper conductivity. Thus, the CMP process must be uniform, controlled, and reproducible on a sub-micron to nano-scale dimension.

In the CMP processes mentioned above, dishing performance, scratches or defects and removal rate of the metal are measurements of CMP performance. These performance measurements may depend on the use of the foregoing working slurries and mechanical polishing processes. Dishing is a measure of how much metal, such as copper, is removed from bond pads or wire traces below the plane of the intermediate wafer surface as defined by the difference in height between the copper and the tops of-the barrier or dielectric layers following removal of the blanket copper or copper plus barrier layer. Removal rate refers to the amount of material removed per unit time. Removal rates greater than at least about 1000 A per minute are preferred. Lower removal rates, such as a few hundred angstroms per minute (A/min) or less, are less desirable because they tend to create increases in the overall manufacturing costs (cost of ownership) associated with wafer manufacture.

To lower the propensity for dishing and increase metal removal rates on semiconductor devices, it is important to design slurries with components in fairly narrow concentration ranges and pH values. The pH of the slurries used in polishing of semiconductor devices is dependent upon the composition of the surface layer to be polished. In most cases, it is necessary to engineer a slurry with a proper pH to effectively produce an oxide layered surface at the same rate the mechanical action of abrasion removes this metal oxide. For example, in polishing dielectric materials such as SiO2, the pH of the slurry is typically >10 to assist in the formation of silanol bonds:

| | |
|---|---|
| $SiO_2 + 2H_2O \longleftrightarrow Si(OH)_{4(aq)}$ | pH < 9 |
| $Si(OH)_{4(aq)} + OH^- \longrightarrow SiO(OH)_3 + H_2O$ | pH > 9 |
| $SiO(OH)_3 \rightarrow$ polynuclear species | pH > 10.5 |
| $2Si(OH)_{4(aq)} \rightarrow$ 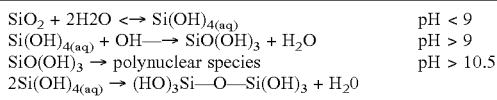 $+ H_2O$ | |

The pH of the $SiO_2$ polishing slurries must be greater than 10 to ensure rapid formation of the silicon dioxide after mechanically polishing the surface.

For copper polishing slurries, U.S. Pat. No. 6,117,783 shows the importance of pH of about 6.0 to form a copper(I) oxide, $Cu_2O$. Cuprous oxide can form only in near-neutral to slightly basic media. In low pH slurries, a protective oxide may not form on the copper surface thus increasing the propensity for aggressive attack by the oxidizing agent on copper metal. In high pH slurries, removed copper may precipitate from solution resulting in un-wanted particulate matter adhering to the wafer surface. Therefore, copper polishing slurries must be formulated within a narrow pH window to ensure a high yield after CMP.

Another important area is to understand with regard to pH control and, if possible, to adjust the slurries is the Zeta potential. The Zeta potential is a electrostatic potential measurement of the interaction of the electrically charged double layer ions of anions and cations that surround the inorganic polishing particles in a slurry. The Zeta potential is dependent upon the nature of the polishing particle (e.g., $Al_2O_3$, $CeO_2$, $SiO_2$ etc.) and the slurry pH. Slurries that exhibit an undesired Zeta potential are typically unstable and as a result the particles may settle from the slurry or agglomerate. This can be very detrimental to its performance during the CMP polishing process.

Another measure of Zeta potential is the isoelectric point (IEP) for the polishing particles. The IEP is the pH at which the Zeta potential value is zero. The chemical composition and nature of the particles can have significant effects on the IEP. Some selected values of the IEP are: aluminum oxide particles can vary from 3.8 to 9.4, while silicon oxide has a narrower range 1.5 to 3.7.

Some metal oxides IEP values are 9.5 for TiO, while for that of pure tungsten is somewhere around about 1. Such wide ranges of IEP values pose a major challenge to developing chemistries to control the Zeta potential of the particles that may eventually adhere to the wafer surface. Additionally, the Zeta potential between the polishing particles and the wafer may be that the particles will be attracted and adhere to the wafer surface which in turn requires that a post CMP clean step is required to remove the adhering particles.

It is therefore critical to maintain the Zeta potential in a given range by holding the pH of the slurry constant during CMP.

It is desirable to provide improvements in chemical mechanical planarization by providing working slurries useful in modifying exposed intermediate surfaces of structured wafers for semiconductor fabrication and to methods of modifying the exposed intermediate surfaces of such wafers for semiconductor fabrication, preferably with improved, sustainable, metal removal rates and utilizing the foregoing family of working slurries. It is especially desirable to provide working slurries that are more stable than commercially available slurries. It is also desirable to provide working slurries that are useful in the aforementioned methods and resulting in the fabrication of metal containing structured wafers with better planarity and less defects.

SUMMARY OF THE INVENTION

The present invention provides an improved composition of slurries and a process for the chemical mechanical polishing or planarization of semiconductor wafers.

In particular, the present invention provides (a) useful slurries necessary to modify exposed intermediate surfaces of structured wafers for semiconductor fabrication, (b) methods of modifying exposed intermediate surfaces of structured wafers for semiconductor fabrication utilizing such a family of working slurries, and (c) semiconductor wafers made according the foregoing process In one aspect, the invention provides a working slurry useful in modifying a surface of a wafer suited for fabrication of a semiconductor device, the slurry being comprised of:
  a. a sulfonated zwitterions,
  b. an oxidizing agent,
  c. a liquid carrier, preferably aqueous,
  d. optionally, inorganic or organic polishing particles,
  e. optionally, a chelating agent, f. optionally, a secondary buffering agent,
g. optionally, a metal or metal oxide passivating agent,
h. optionally, a surfactant, viscosity modifier, wetting agent, lubricant, soap, and the like, and
i. optionally, a stopping compound to increase metal selectively.

In another aspect, the invention provides a method of modifying a surface of a wafer suited for fabrication of a semiconductor device comprising the steps of:
a) providing a wafer comprising a first material having a surface etched to form a pattern and a second material deposited over the surface of the first material,
b) contacting the second material of the, wafer with slurry of the invention used in conjunction with a polishing pad, the slurry comprising a plurality of loose abrasive particles dispersed in a slurry, and
c) relatively moving the wafer while the slurry and polishing pad are in contact with the exposed surface of the wafer until the wafer is planar and comprises at least one area of exposed first material and one area of exposed second material.

Another embodiment of the invention are articles of manufacture that contain metal surfaces produced from slurries of this invention.

DETAILED DESCRIPTION OF THE INVENTION

It has now been found that the addition of sulfonated zwitterions to conventional slurries increases the copper removal rates and also offers buffering action to the slurry.

The invention provides a family of working slurries for use in modifying or refining intermediate surfaces of patterned wafers suited for semiconductor fabrication. The invention also provides methods for utilizing such working slurries to modify the intermediate surfaces of semiconductor.

CMP slurries of the invention are characterized in significant part by comprising a sulfonated zwitterion and an oxidizing agent.

Without being bound by theory, it is believed that the sulfonated zwitterion can modulate the pH of the slurry in the desired range to effectively promote a surface copper oxide that is subsequently abraded from the surface of the electronic device. In addition, the zwitterions of this invention are characterized by having a nitrogen and sulfonic acid moieties that may be capable of forming a copper complex which minimized the propensity for copper deposition onto the back of the silicon device.

Compositions of the present invention suitably contain a slurry, preferably aqueous, of a sulfonated zwitterion, an oxidizing agent, optionally inorganic polishing particles, optionally a chelating agent, optionally a secondary buffering agent, optionally a passivating agent, optionally surfactants, viscosity modifiers, wetting agents, lubricants, soaps, and the like.

A liquid carrier is used to produce the slurry. The liquid carrier may be aqueous or non-aqueous so long a the carrier is compatible in the environment in which it will be used. The preferred carrier is aqueous.

As discussed above, sulfonated zwitterions of the invention are particularly effective in various CMP slurries to effectively remove metal layers, barrier layers and dielectrics found in electronic devices. In particular, slurries of this invention are useful for the removal of copper on integrated circuits such as that produced in Damascene structures.

CMP slurries of this invention generally comprise at least one soluble sulfonated zwitterion. A variety of sulfonated zwitterions may be introduced as the alkyl acid or salt of:

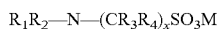

where $R_1$ and $R_2$ may be an alkyl, aryl, hydroxide, hydrogen, an hetro atom ring, an aryl ring or an alkyl ring structure, $R_3$ and $R_4$ may be a halogen, alkyl, aryl, hydroxide, hydrogen, an hetro atom ring, an aryl ring or an alkyl ring structure, x can be two to four and M may be hydrogen, an alkali or alkaline earth metal, amine or ammonium ion. The preferred sulfonated zwitterions are: .2-(N-Morpholino)ethanesulfonic acid, (3-[N-Morpholino])propanesulfonic acid, 2-[(2-Amino-2-oxoethyl)amino]ethanesulfonic acid, Piperazine-N, N'-bis(2-ethanesulfonic acid), 3-(N-Morpholino)-2-hydroxypropanesulfonic acid, N ,N-Bis(2-hydroxyethyl)-2-aminoethanesulfonic acid, 3-(N-Morpholino) propanesulfonic acid, N-(2-Hydroxyethyl)piperazine-N'-(2-ethanesulfonic acid), N-Tris(hydroxymethyl)methyl-2 aminoethanesulfonic acid, 3-[N ,N-Bis(2-hydroxyethyl) amino]-2-hydroxypropanesulfonic acid, 3-[N-Tris(hydroxymethy l)methylamino)-2-hydroxypropanesulfonic acid, N-(2-hydroxyethyl)piperazine-N'-(2-hydroxypropanesulfonic acid), Piperazine-N ,N'-bis(2-hydroxypropanesulfonic acid), N-(2-Hydroxyethyl)piperazine-N'-(3-propanesulfonic acid), N-Tris(hydroxymethyl)methyl-3-aminopropanesulfonic acid, 3-[(1,1-Dimethy 1-2-hydroxyethyl)amino]-2-hydroxypropanesulfonic, acid, 2-(N-Cyclohexylamino)ethanesulfonic acid, 3-(Cyclohexylamino)-2-hydroxy-1-propanesulfonic acid, 2-Amino-2-methyl-l-propanol, 3-(Cyclohexylamino)-1-propanesulfonic acid.

The sulfonated zwitterion may be suitably present in a wide concentration range. Preferably, a sulfonated zwitterion may have a concentration range from about 0.01 g/l to about 100 g/l, more preferably from about 5 g/l to about 75 g/l and still more preferably from about 10 g/l to about 50 g/l.

Preferably, the zwitterions concentration is maintained at such concentrations to effectively maintain the pH in the desired range for copper oxide promotion and assist in chelating the removed copper.

Suitable chemical oxidizing agents include hydrogen peroxide, cupric chloride; persulfates of ammonium, sodium and potassium; ferric chloride; potassium ferricyanide; nitric acid, potassium nitrate, ammonium molybdate, potassium iodate, hydroxylamine, diethylhydroxylamine, OXONE, transition metal complexes such as ferricyanide, ammonium ferric EDTA, ammonium ferric citrate, ferric citrate, ammonium ferric oxalate, urea-hydrogen peroxide, sodium peroxide, benzyl peroxide, di-t-butyl peroxide, peracetic acid, monopersulfuric acid, dipersulfuric acid, iodoic acid, and salts thereof, and combinations thereof. The concentration of the oxidizing agent in deionized water may range from about 0.01 to 50% by weight, preferably 0.02 to 40% by weight. Where hydrogen peroxide is used as the oxidizing agent, it is typically present in an aqueous solution at a concentration (weight percentage) within the range from about 0.5% to about 15%, preferably from about 1.0% to about 7.5% and most preferably from about 1.0% to about 5.0%.

The CMP slurry can also contain additives such as a polishing particles (either inorganic or organic abrasive particles), a buffer, metal chelating agents, passivating agents, surfactants, viscosity modifiers, wetting agents, lubricants, soaps, and the like.

Inorganic abrasive particulates may also be included in the working slurry. These inorganic particulates may be used to increase the removal rate of the metal and/or the dielectric. Examples of such inorganic particulates include: $SiO_2$, $Al_2O_3$, $CeO_2$, zirconia, calcium carbonate, garnet, silicates and titanium dioxide. The average particle size of these inorganic particulates should be less than about 1,000 Angstroms, preferably less than about 500 Angstroms and more preferably less than about 250 Angstroms. Preferably, the working slurry contains less than 10% by weight, preferably less than 1% by weight and more preferably than 0.5% by weight inorganic particulates. Although abrasive particles may be added to the CMP slurry, CMP processes using three-dimensional abrasive particles may be fixed to an abrasive polishing pad will preferably provide for a substantially abrasive free slurry.

Secondary buffers may be added to the working slurry to assist in pH control. As mentioned above, the pH can have a significant effect on the nature of the copper surface, and the copper removal rate. The most preferred buffers are compatible with semiconductor, post-CMP cleaning needs as well as minimizing the potential to induce impurities such as alkali and alkaline metals in the slurry. In addition, the most preferred buffers can be adjusted to cover the p H range from acidic to near-neutral to basic. Mono, di and polyprotic acids may act as buffers, and when fully or partially deprotonated with bases such as ammonium hydroxide. Ammonium salts of the acids are preferred but other alkali and alkaline earth metal salts of the carboxylic acids may be used. Representative examples include salts of carboxylic acids include, for example, di-carboxylic acids, tri-carboxylic acids, and poly-carboxylic acids. Preferred containing compounds include, for example, malonic acid, oxalic acid, citric acid, tartaric acid, succinic acid, malic acid, adipic acid, salts thereof, and mixtures thereof. Nitrogen containing compounds that may buffer the slurry include: aspartic acid, glutamic acid, histidine, lysine, arginine, ornithine, cysteine, tyrosine, and carnosine, Bis(2-hydroxyethyl)iminotris(hydroxymethyl)methane, Tris(hydroxymethyl)aminomethane, N-(2-Acetamido)-2-iminodiacetic acid, 1,3-Bis[tris(hydroxymethyl)methylamino]propane, triethanolamine, N-Tris(hydroxymethyl)methylglycine, N,N-Bis(2-hydroxyethyl)glycine and glycine. Ammonium hydrogen phosphate may also be used in the slurry of the invention.

Copper removal from the wafer surface may be enhanced with the use of a chelating agent or complexing agent the CMP slurry of the invention. The oxidation and dissolution of copper is enhanced by the addition of complexing agents that bond to copper to increase the solubility of dissolved copper metal or copper oxides in water.

In the working slurries of the present invention, complexing agent is always present at a concentration from about 0.01 to 50% by weight. During the planarization of copper, the preferred complexing agents acids or salts of: citric, oxalic iminodiacetic, 2-aminoethyl phosphonic acid, aminotri(methylenephosphonic acid) 1-hydroxyethylidene-1,1-di-phosphonic acid and diethylenetri-aminepenta(methylenephosphonic acid). The concentration of the chelating agents in the slurry may range from 0.01% to about 50% by weight, preferably from 0.5% to about 10% by weight and most preferably from 1% to about 10% by weight.

Corrosion inhibitors or passivating agents are well known for copper. Copper is known to be somewhat passivated by cuprous oxide, especially at neutral or mildly alkaline pH. The addition of passivating agent to the working slurry may protect areas of a copper surface not yet in contact with the abrasive article from premature, excessive removal by the oxidizing agent or control the concentration of the oxidizing agent reacting with the exposed metal surface. The most widely used inhibitors for copper are tolyltriazole, mercaptobenzothiazole and benzotriazole and their derivatives known as azole derivatives. The amount and type of passivating agent will depend in part of the desired planarization criteria (removal rate, surface finish and planarity). The preferred concentration in the working slurry (weight percentage) is within the range between about 0.025% and about 0.20%, preferably between about 0.050% and about 0.15% and more preferably between about 0.050% and about 0.10%.

The slurry of the invention may also comprise a surfactant from a concentration of about 0.1% to about 15% by volume. Examples of surfactants included polyethylene glycol, polypropylene glycol, polyoxyethylene ether, glycerol, polyoxyethylene lauryl ether, polyoxyethylene cetyl ether, polyoxyethylene stearyl ether, polyoxyethylene oleyl ether and mixtures thereof.

The slurry of the invention may also comprise viscosity modifiers to achieve a desired viscocity of about 5 centipoise to about 25 centipoise. Examples of viscosity modifiers include Polyox™ available from Union Carbide and Carpool™ available from B. F. Goodrich. Those skilled in the art will appreciate that surfactants, viscosity modifiers and other known additives may be added to the working slurry as may be required in a particular application.

The slurry of the invention may also comprise a stopping compound that inhibits the ability of the system to polish at least a portion of one or more layers of a multi-layer substrate. The preferred concentration in the working slurry (weight percentage) is within the range between about 0.025% and about 20%, preferably between about 0.10% and about 10% and more preferably between about 0.50% and about 5%.

Suitable stopping compounds adsorb to the first metal layer, the second layer, and/or one or more additional layers of a multi-layer substrate and at least partially inhibit the removal of the 1 ayer(s) by the slurry of the present invention. Preferably, the stopping compound at least partially inhibits the removal of the second layer by the slurry.

The term "at least partially inhibits" as used herein means that the system has a polishing selectivity of the first metal layer:second layer of at least about 10:1, preferably at least about 30:1, more preferably at least about 50:1, and most preferably at least about 100:1. The stopping compound can be any suitable cationically charged nitrogen-containing compound selected from the group of compounds comprising amines, imines, amides, imides, polymers thereof, and mixtures thereof. Suitable stopping compounds also include, for example, cationically charged nitrogen-containing compounds selected from the group of compounds comprising amines, imines, amides, imides, polymers thereof, and mixtures thereof, wherein the stopping compound is not a sulfur-containing compound or an azole compound. Cationically charged as used herein means that a fraction (e.g., >1%) of the stopping compound is protonated at the operating pH of the system of the present invention. Preferred stopping compounds also are oppositely charged from the surface charge of the metallic layer that is not to be polished.

The slurry of the invention may also comprise a wetting agent that assists the slurry in uniformly covering the wafer surface. The wetting agent can be cationic, anionic, nonionic, amphoteric, completely or partially fluorinated or mixtures thereof.

The slurry can be used from about 10° C. to about 70° C., more preferably from about 15° C. to about 60° C. and most preferably from about 20° C. to about 50° C.

In another aspect, the invention provides a method of modifying a surface of a wafer suited for fabrication of a semiconductor device comprising the steps of:

(a) providing a wafer comprising a first material having a surface etched to form a pattern and a second material deposited over the surface of the first material;

(b) contacting the second material of the wafer with slurry of the invention used in conjunction with a polishing pad, the slurry comprising a plurality of loose abrasive particles dispersed in a slurry;

(c) relatively moving the wafer while the slurry and polishing pad are in contact with the exposed surface of the wafer until the wafer is planar and comprises at least one area of exposed first material and one area of exposed second material.

The method is preferably directed to modifying intermediate surfaces of a patterned wafer. The first material is typically a dielectric material with an intermediate material or adhesion/barrier layer applied thereover. Some suitable intermediate materials or adhesion barrier layers include tantalum, titanium, tantalum nitride, titanium nitride. Other suitable intermediate materials or adhesion/barrier layers include metals, nitrides, and silicides. The gemometries associated with the first material include patterned areas, grooved areas, and vias, as well as other structures that produce a semiconductor device. The second material is typically a conductive material selected from titanium, silver, aluminum, tungsten, copper, or alloys thereof. The present method is particularly adapted to modifying conductive surfaces of materials having resistivity values typically less than about 0.1 ohm-cm. In general, preferred dielectric materials will have dielectric constants less than about 5.

In this aspect, the working slurry containing the sulfonated zwitterion and inorganic particles is as described above.

The movement between the wafer and the polishing pad occurs under pressure in the general range from about 0.1 to about 25 psi, preferably under in a range from about 0.2 to about 15 psi and most preferably in a range from about 1 to about 6 psi. The wafer and polishing pad may be rotated and/or moved against each other in a linear fashion, circular fashion, spiral fashion, a non-uniform manner, elliptical fashion or a random motion fashion. The wafer holder or the base may also oscillate or vibrate, such as by transmitting ultrasonic vibrations through the holder or base. For example, either the polishing pad or the wafer or both the polishing pad and the wafer are rotated relative to the other a well as being moved linearly along relative centers of the wafer and pad. The rotational motion or speed of rotation between the wafer and polishing pad may be between 1 rpm to 10,000 rpm. Preferred rotational speeds for the pad are at a speed between 10 rpm to 1,000 rpm, and more preferably between 10 rpm to 250 rpm and most preferably between 10 rpm to 60 rpm. Preferred rotational speeds for the wafer are between 2 rpm to 1,000 rpm, more preferably between 5 rpm to 500 rpm, and still more preferred between 10 rpm to 100 rpm.

The CMP slurries of the invention may be used without the inorganic polishing particles mixed in the aqueous medium. Rather, a fixed abrasive pad whereby a fixed three-dimensional abrasive pad having numerous abrasive particles extending throughout at least a portion of its thickness, is used such that removing some of the particles during planarization exposes additional abrasive particles capable of performing the planarization function. A preferred abrasive polishing pad comprises a plurality of abrasive particles fixed and dispersed in a binder.

In this fixed abrasive polishing method, contact and motion is maintained between the fixed abrasive pad and the wafer until an exposed surface of the wafer is planar and comprises at least one area of exposed second or conductive material and at least one area of exposed first or dielectric material, and the exposed area of conductive material and the exposed area of dielectric material lay in a single plane. The dielectric material may be covered by one or more intermediate materials such as an adhesion or barrier layer. Usually, the exposed dielectric material surface is essentially free of the intermediate material after removal of the excess conductive material. Alternatively, removal of the metal layer may expose only the surfaces of the intermediate material. Continued modification may then expose on the surface of the wafer the dielectric material and the metal layer.

The abrasive pad used with the slurries of this invention may be circular in shape, e.g., in the form of an abrasive disc. The outer edges of the circular abrasive disc are preferably smooth or, alternatively, may be scalloped. The abrasive article may also be in the form of an oval or of any polygonal shape such as triangular, square, rectangular, and the like. Alternatively, the fixed abrasive pad may be in the form of a brush, belt or in the form of a roll, typically referred to in the CMP polishing industry as abrasive tape rolls. Abrasive tape rolls may be indexed during the modification process. The abrasive article may be perforated to provide openings through the abrasive coating and/or the backing to permit the passage of the slurry medium before, during or after use.

The interface pressure between the abrasive article and wafer surface (i.e., the contact pressure) is typically less than about 30 pounds per square inch (psi), preferably less than about 15 psi, more preferably less than about 6 psi. Also, two or more processing conditions within a planarization process may be used. For example, a first processing segment may comprise a higher interface pressure than a second processing step. Rotation and translational speeds of the wafer and/or the abrasive pad also may be varied during the planarization process.

Recessed portions of the abrasive pad may act as channels to help distribute the working slurry over the entire wafer surface. The recessed portions may also act as channels to help remove the worn abrasive metallic particles and other debris from the wafer and abrasive article interface. The recessed portions may also prevent the phenomenon known in the art as "stiction" where the abrasive article tends to stick to or become lodged against the wafer surface.

Methods directed toward producing uniform wear rates across the surface of the object being polished and or across the surface of the polishing pad are discussed in U.S. Pat. Nos. 5,177,908; 5,234,867; 5,297,364; 5,486,129; 5,230,184; 5,245,790; and 5,562,530. These methods may be adapted for use in the present invention. Variations of the wafer planarization process which employ either a continuous belt or a supply roll of sheet pad material in conjunction with a slurry may also be employed by substituting a belt or roll of textured, three-dimensional abrasive composite and working slurry of this invention.

The amount of the working slurry of the invention applied to the wafer surface is preferably sufficient to aid in the removal of metal or metal oxide layer from the surface. In most cases, there is sufficient slurry from the working slurry of the invention. It will also be appreciated that some planarization applications may require that a second slurry is present at the planarization interface in addition to the slurry of this invention. This second slurry may be the same as the first slurry, or it may be different. The flow rate for dispersing the working slurry typically ranges from about 10 to 1,000 milliliters/minute, preferably 10 to 500 milliliters/minute, and more preferably between about 25 to 250 milliliters/minute.

The surface finish of the wafer may be evaluated by known methods. One preferred method is to measure the Rt value of the wafer surface which provides a measure of "roughness" and may indicate scratches or other surface defects. The wafer surface is preferably modified to yield an Rt value of no greater than about 1000 Angstroms, more preferably no greater than about 100 Angstroms, and even more preferably no greater than about 50 Angstroms.

There can be numerous process steps for a single semiconductor wafer. Therefore, a relatively high removal rate of metal layer is desired. With the CMP slurries described herein, the removal rate will typically be at least 1000 Angstroms per minute, preferably at least 2000 Angstroms per minute, more preferably at least 3000 Angstroms per minute, and most preferably at least 4000 Angstroms per minute. The removal rate of the metal may vary depending upon the CMP tool and the type of wafer surface being processed. Although it is generally desirable to have a high removal rate, the removal rate preferably will not be so high as to compromise the desired surface finish and/or topography of the wafer surface or make the control of the planarization process difficult.

The invention is further illustrated in the non-limiting examples set forth below.

EXAMPLE 1

This example shows the effectiveness of sulfonated zwitterions in promoting copper removal from semiconductor wafers. Copper wafers were polished to using commercial slurry from Fujimi, PL-7102. The wafer was rotated at 80 RPM (or 0.62 meter per sec relative pad-wafer velocity) using a wafer pressure of 3 PSI (or 20684 Pa). The polishing pad was a Rodel IC-1000 XY-Groove. The slurry flow rate was 80 cc per minutes at the center of pad. The following removal rates (in nanometers/minute) were obtained:

| Slurry | Removal Rate (nm/min) |
| --- | --- |
| Blank (No Additive) | 363.5 |
| +15 g/l Piperazine-N,N'-bis(2-ethanesulfonic acid) | 440.5 |
| +15 g/l N-(2-Hydroxyethyl)piperazine-N'-(2-ethanesulfonic acid) | 534.0 |
| +50 g/l 3-[N-Morpholino])propanesulfonic acid | 567.6 |
| +50 g/l 2-(N-Morpholino)ethanesulfonic acid | 541.3 |
| +50 g/l N,N-Bis(2-hydroxyethyl)-2-aminoethanesulfonic acid | 520.9 |

An increase in the copper removal rate is seen due to the sulfonated zwitterions.

EXAMPLE 2

This example shows the effectiveness of the sulfonated zwitterions in maintaining pH during exposure to an oxidizing solution.

Pure copper foil was cut into coupons approximately 4 cm by 4 cm. The copper was cleaned cathodically at 4.0 V in a solution containing 50 g/l sodium hydroxide at 60° C. for 30 seconds. After cleaning, the copper foil was rinsed in distilled water then immersed in 5% sulfuric acid for 5 second. The copper was again rinsed in distilled water.

Compositions were prepared as detailed in the accompanying table. The "blank" solution contained only 2% hydrogen peroxide, the pH adjusted to 6.00. Several sulfonated zwitterions were tested for their ability to maintain pH over a five hour period.

| Composition | Initial pH | pH @ 5 Hrs, (Δ pH - 5 Hrs.) | Voltage (vs SCE) | Appearance of Cu Foil |
| --- | --- | --- | --- | --- |
| Blank (2% H$_2$O$_2$) | 6.00 | 5.62 (−0.38) | +0.3350 | Shiny |
| +25 g/l 2-(N-Morpholino)ethanesulfonic acid, sodium salt | 6.03 | 5.98 (−0.05) | +0.3150 | Tarnished |
| +50 g/l 2-(N-Morpholino)ethanesulfonic acid, sodium salt | 6.04 | 5.98 (−0.06) | +0.3100 | Tarnished |
| +25 g/l 2-(N-Morpholino)ethanesulfonic acid | 6.04 | 6.01 (−0.03) | +0.3100 | Tarnished |
| +50 g/l 2-(N-Morpholino)ethanesulfonic acid | 6.03 | 5.99 (−0.04) | +0.3100 | Tarnished |
| +50 g/l N-(2-Hydroxyethyl)piperazine-N'-(2-ethanesulfonic acid | 6.01 | 5.94 (−0.05) | +0.3550 | Tarnished |
| +50 g/l Piperazine-N,N'-bis(2-ethanesulfonic acid) | 6.01 | 5.86 (−0.15) | +0.3300 | Tarnished |
| +50 g/l 3-[N-Morpholino])propanesulfonic acid | 6.01 | 5.93 (−0.08) | +0.3150 | Tarnished |

It is seen the solution containing only $H_2O_2$ resulted in a pH change of −0.38 while those containing the sulfonated zwitterions maintain the pH close to the original value.

EXAMPLE 3

This example compares buffers described in the literature to those in this invention.

Copper foil was cleaned as discussed in Example 2. The cleaned copper samples were immersed in the following solutions for 24 hours and changes in pH, weight of the copper foil and appearance of the copper were recorded.

| Composition | Initial pH | Initial Cu Weight (gms) | Final pH (Δ pH - 24 Hrs.) | Final Cu Weight (% Wt Change) | Appearance of Cu Foil |
|---|---|---|---|---|---|
| Blank (2% $H_2O_2$) | 6.01 | 0.1697 | 4.17 (−1.84) | 0.1669 (−1.6%) | Lightly Tarnished |
| +50 g/l Potassium Citrate | 6.00 | 0.1722 | 6.45 (+0.45) | Dissolved | Dissolved |
| +50 g/l Potassium Phosphate | 6.01 | 0.1949 | 6.04 (+0.03) | 0.1975 (+1.3%) | Green Coating on Cu |
| +50 g/l 3-[N-Morpholino])propanesulfonic acid | 6.01 | 0.2116 | 5.18 (−0.83) | 0.2111 (−0.24%) | Heavily Tarnished |
| +50 g/l 2-(N-Morpholino)ethanesulfonic acid | 6.00 | 0.1771 | 5.79 (−0.21) | 0.1784 (+0.73%) | Heavily Tarnished |
| +30 g/l Glycine | 5.99 | 0.2237 | 6.21 (+0.22) | Dissolved | Dissolved |

The "blank" composition exhibited a significant pH drift after 24 hours. The copper was slightly tarnished indicating some degree of oxidation. The composition containing citrate as the buffer/chelating agent maintained the pH but the very strong complexing ability, of citrate towards copper completely dissolved the copper foil showing the aggressiveness of this buffer. The composition containing phosphate as the principal buffer again maintained the pH but a heavy green film formed on the copper surface, something undesirable in CMP applications. The composition containing the sulfonated zwitterions-type buffers held the pH closer to the starting pH than the "blank" solution, formed the required oxide or tarnished film yet did not aggressively attack or dissolve the copper specimen.

EXAMPLE 4

This example shows the use of OXONE ($2KHSO_5 \cdot KHSO_4 \cdot K_2SO_4$) as the oxidizing agent and the effects of the zwitterions-type buffers.

The copper foil was cleaned as discussed in Example 2. The cleaned copper samples were immersed in the following composition for 24 hours and changes in pH, appearance of the copper and the changes in solution color were recorded.

| Composition | Initial pH | Initial Cu Weight | Δ pH 5 Hrs. | Appearance After 5 Hrs. | Solution Color after 5 Hrs. |
|---|---|---|---|---|---|
| OXONE (20 g/l) | 6.00 | 0.2010 | 3.94 (−2.06) | Blotchy | Lt. Blue → Greenish/Blue w/increase in pH |
| +50 g/l Piperazine-N,N'-bis(2-ethanesulfonic acid) | 6.01 | 0.1972 | 5.46 (−0.55) | Oxidized (Dull) Surface | Clear |
| +50 g/l Hydroxyethyl)piperazine-N'-(2-ethanesulfonic acid) | 6.02 | 0.2537 | 5.71 (−0.32) | Oxidized (Dull) Surface | Clear |
| +25 g/l 2-(N-Morpholino)ethanesulfonic acid | 6.00 | 0.2008 | 5.75 (−0.25) | Oxidized (Dull) Surface | Amber |
| +50 g/l N,N-Bis(2-hydroxyethyl)-2-aminoethanesulfonic acid | 6.01 | 0.2103 | 5.63 (−0.38) | Dark Brown Surface | Clear |

The composition containing only OXONE showed a change in pH of about −2.06 units while those containing the sulfonated zwitterions-type buffers exhibited a pH change of less than −1.0. The copper foil immersed in the OXONE only solution was blotchy and unevenly etched. The surfaces of the copper foils immersed in OXONE solutions containing the sulfonated zwitterions were evenly oxidized.

EXAMPLE 5

This example shows the use of hydroxylamine as the oxidizing agent and the effects of the sulfonated zwitterions-type buffers.

The copper foil was cleaned as discussed in Example 2. The cleaned copper samples were immersed in the following composition for 5 hours and changes in pH and the changes in solution color were recorded.

| Composition | Initial pH | Final pH (Δ pH - 5 Hrs.) | Solution Color after 5 hrs. |
|---|---|---|---|
| Blank (0.50 M NH₂OH) | 6.01 | 5.64 (−0.41) | Clear |
| +50 g/l Piperazine-N,N'-bis(2-ethanesulfonic acid) | 5.99 | 5.96 (−0.03) | Very Lt. Purple |
| +50 g/l Hydroxyethyl)piperazine-N'-(2-ethanesulfonic acid) | 6.00 | 5.95 (−0.05) | Lt. Blue/Purple |
| +50 g/l 3-[N-Morpholino])propanesulfonic acid | 6.02 | 5.96 (−0.06) | Lt. Blue/Purple |
| +50 g/l 2-(N-Morpholino)ethanesulfonic acid | 5.98 | 6.01 (+0.03) | Very Lt. Blue |
| +30 g/l Glycine | 6.01 | 5.99 (−0.02) | Dk. Blue |
| +50 g/l N,N-Bis(2-hydroxyethyl)-2-aminoethanesulfonic acid | 6.01 | 5.92 (−0.09) | Very Lt. Blue |

The composition containing only hydroxylamine showed a change in pH of about −0.46 units while those containing the sulfonated zwitterions-type buffers exhibited a pH change of less than −0.10. The composition containing only hydroxylamine was clear indicating either very little copper dissolution or cuprous ion dissolved in solution. The hydroxylamine compositions containing glycine was deep blue indicating rapid dissolution of copper to cupric ions. The hydroxylamine compositions containing the sulfonated zwitterions were lightly colored showing dissolution of cupric ions followed by complexation (indication of color implies chromophores of copper-zwitterion complex).

EXAMPLE 6

This example shows the use of hydroxylamine as the oxidizing agent and the effects of the sulfonated zwitterions-type buffers after long exposure times to copper.

The copper foil was cleaned as discussed in Example 2. The cleaned copper samples were immersed in the following compositions for 5 hours and changes in pH, changes in the weight of the copper after exposure to the electrolytes and the changes in solution color were recorded.

| Composition | Initial pH | Initial Cu Weight (gms.) | Final pH (Δ pH - 24 Hrs.) | Final Cu Weight (% Wt Change) | Solution Color at End of Test |
|---|---|---|---|---|---|
| Blank (0.50 M NH₂OH) | 6.01 | 0.2150 | 4.83 (−1.18) | 0.2026 (−5.76%) | Lt. Blue |
| +50 g/l Potassium Citrate | 6.01 | 0.2204 | 6.17 (+0.16) | 0.0128 (−94.1%) | Lt. Blue |
| +50 g/l Potassium Phosphate | 6.00 | 0.2541 | 5.85 (−0.15) | 0.2448 (−3.7%) | Lt. Blue |
| +50 g/l Piperazine-N,N'-bis(2-ethanesulfonic acid) | 5.99 | 0.2108 | 5.54 (−0.45) | 0.1760 (−16.5%) | Lt. Blue |
| +50 g/l Hydroxyethyl)piperazine-N'-(2-ethanesulfonic acid) | 6.00 | 0.1851 | 5.31 (−0.69) | 0.1458 (−21.2%) | Lt. Blue |
| +50 g/l 2-(N-Morpholino)ethanesulfonic acid | 5.98 | 0.1981 | 5.69 (−0.29) | 0.1524 (−36.2%) | Green |
| +30 g/l Glycine | 6.01 | 0.2082 | 5.89 (−0.12) | Dissolved | Lt. Blue |
| +50 g/l N,N-Bis(2-hydroxyethyl)-2-aminoethanesulfonic acid | 6.01 | 0.2430 | 5.62 (−0.39) | 0.1960 (−19.3%) | Dark Blue |

The "blank" composition containing only hydroxylamine showed a −1.18 unit change in pH and had a modest weight loss of about 5.67%. The use of citrate and glycine maintained the. pH of the solution but aggressively attacked the copper foil resulting in excess dissolution of the copper. Similarly, the use of a phosphate buffer maintains the pH during the test but the surface of the copper foil is covered with an unwanted, green copper. phosphate coating which is difficult to handle during CMP processes. The use of sulfonated zwitterions-type buffers exhibit modest copper dissolution yet maintain the pH better than the un-buffered solution. The presence of color in the sulfonated zwitterions-buffered solutions indicates some degree of cupric complexation by these buffers.

What is claimed is:

1. A method of modifying a surface of a wafer, via abrasive removal of material, suited for fabrication of a copper based semiconductor device comprising the steps of:
   a. providing a wafer comprising a first material having a surface etched to form a pattern and a second material deposited over the surface of the first material;
   b. contacting the second material of the wafer with polishing pad in the presence of a working slurry; and
   c. relatively moving the wafer or polishing pad, to abrasively remove material, while the second material is in contact with a polishing pad until an exposed surface of the wafer is planar and comprises at least one area of exposed first material and one area of exposed second material, wherein the working slurry is comprised of:
   (a) a sulfonated zwitterions,
   (b) an oxidizing agent,
   (c) a liquid carrier,
   (d) optionally, inorganic polishing particles,
   (e) optionally, a chelating agent,
   (f) optionally, a secondary buffering agent,
   (g) optionally, a passivating agent,
   (h) optionally, surfactants, viscosity modifiers, wetting agents, lubricants, soaps, and the like, and
   (i) optionally, a stopping compound.

2. The method of claim 1 wherein the polishing particles are in the composition.

3. The method of claim 1 wherein the polishing particles are fixed on the polishing pad.

4. The method of claim 1 wherein no polishing particles are used.

5. The method of claim 1 wherein the polishing pad comprises a slurry and a polymer pad, the slurry comprising a plurality of loose abrasive particles dispersed in a slurry, the slurry contacting the metal layer of the wafer by the application of the polishing pad.

6. The method of claim 1 wherein the first material is a dielectric material and the second material is a conductive copper based material.

7. The method of claim 1, wherein the wafer further comprises a barrier layer covering the dielectric material.

* * * * *